United States Patent
Cornes et al.

(10) Patent No.: US 10,327,357 B2
(45) Date of Patent: Jun. 18, 2019

(54) THERMAL CONDUCTION TO A CYLINDRICAL SHAFT

(71) Applicant: Artesyn Embedded Computing, Inc., Tempe, AZ (US)

(72) Inventors: Martin Peter John Cornes, Phoenix, AZ (US); Suzanne Marye Wong, Tempe, AZ (US); Ross L. Armstrong, Phoenix, AZ (US); Douglas L. Sandy, Chandler, AZ (US)

(73) Assignee: Artesyn Embedded Computing, Inc., Tempe, AZ (US)

( * ) Notice: Subject to any disclaimer, the term of this patent is extended or adjusted under 35 U.S.C. 154(b) by 399 days.

(21) Appl. No.: 14/490,186

(22) Filed: Sep. 18, 2014

(65) Prior Publication Data

US 2016/0088776 A1 Mar. 24, 2016

(51) Int. Cl.
*H05K 1/18* (2006.01)
*H05K 5/02* (2006.01)
(Continued)

(52) U.S. Cl.
CPC ......... *H05K 7/2039* (2013.01); *H05K 1/0201* (2013.01); *H05K 1/0203* (2013.01);
(Continued)

(58) Field of Classification Search
CPC .... H05K 7/2039; H05K 1/181; H05K 5/0247; H05K 5/03; H05K 7/1427; H05K 1/0203; H05K 7/20436; H05K 7/026; H05K 2201/066; H05K 1/0201; H05K 1/0204; H05K 3/30; H05K 7/023; H05K 7/20963;
(Continued)

(56) References Cited

U.S. PATENT DOCUMENTS

| | | | | |
|---|---|---|---|---|
| 2,833,966 A | * | 5/1958 | Goodier | H01J 5/12 165/185 |
| 4,400,858 A | * | 8/1983 | Goiffon | E21B 47/011 138/108 |

(Continued)

FOREIGN PATENT DOCUMENTS

| | | |
|---|---|---|
| CN | 103370996 A | 10/2013 |
| CN | 203279430 U | 11/2013 |
| WO | WO-2005032231 A1 * 4/2005 | ......... H05K 7/20445 |

OTHER PUBLICATIONS

English translation of Chinese Office Action for Application No. 201510423192.1 dated May 18, 2018.

*Primary Examiner* — Cassey D Bauer
*Assistant Examiner* — Miguel A Diaz
(74) *Attorney, Agent, or Firm* — Harness, Dickey & Pierce, P.L.C.

(57) ABSTRACT

A canister system having a cylindrical housing and a modular electronic rack system disposed within the cylindrical housing. The modular electronic rack system includes a thermal contact member that is in at least selective physical contact with an interior surface of the cylindrical housing to permit conductive heat transfer there through. An input/output device extends along at least a portion of the modular electronic rack system and includes a power input and a signal output electrically coupled thereto. A plurality of electronic slots disposed at a position generally along the modular electronic rack system is provided.

8 Claims, 3 Drawing Sheets

(51) Int. Cl.
  *H05K 7/02* (2006.01)
  *H05K 7/14* (2006.01)
  *H05K 7/20* (2006.01)
  *F28F 7/00* (2006.01)
  *H05K 1/02* (2006.01)
  *G06F 1/18* (2006.01)
  *G06F 1/20* (2006.01)

(52) U.S. Cl.
  CPC ............. *H05K 7/20* (2013.01); *H05K 7/2049* (2013.01); *H05K 7/20436* (2013.01); *G06F 1/183* (2013.01); *G06F 1/188* (2013.01); *G06F 1/20* (2013.01); *H05K 1/0204* (2013.01); *H05K 1/181* (2013.01); *H05K 5/0247* (2013.01); *H05K 7/023* (2013.01); *H05K 7/026* (2013.01); *H05K 7/1427* (2013.01); *H05K 7/20409* (2013.01); *H05K 7/20418* (2013.01); *H05K 7/20427* (2013.01); *H05K 7/20445* (2013.01); *H05K 2201/066* (2013.01)

(58) Field of Classification Search
  CPC ............... H05K 7/0203; H05K 7/0201; H05K 7/20418; H05K 7/20427; H05K 7/20409; H05K 7/20445; H05K 7/2049; H01L 2924/00; H01L 2924/0002; H01L 23/34; H01L 2023/4062; H01L 21/4882; G06F 1/20; G06F 1/183; G06F 1/188; B23P 15/26
  See application file for complete search history.

(56) References Cited

U.S. PATENT DOCUMENTS

| | | | | |
|---|---|---|---|---|
| 4,485,398 A * | 11/1984 | Chapin, Jr. | ............ | H04N 5/232 348/333.01 |
| 4,520,428 A * | 5/1985 | Lusk | ............ | H05K 7/1417 211/41.17 |
| 4,858,068 A * | 8/1989 | Bitller | ............ | F16B 3/00 138/108 |
| 5,069,516 A * | 12/1991 | Kohy | ............ | G02B 6/4439 174/38 |
| 6,118,662 A * | 9/2000 | Hutchison | ............ | H05K 7/20445 165/80.1 |
| 6,292,556 B1 * | 9/2001 | Laetsch | ............ | H05K 7/20445 361/690 |
| 6,351,383 B1 * | 2/2002 | Payton | ............ | F42B 15/08 165/80.3 |
| 6,404,637 B2 * | 6/2002 | Hutchison | ............ | H04Q 1/10 165/185 |
| 6,507,494 B1 * | 1/2003 | Hutchison | ............ | H01R 13/622 361/704 |
| 6,510,223 B2 * | 1/2003 | Laetsch | ............ | H05K 7/20445 361/690 |
| 6,778,389 B1 * | 8/2004 | Glovatsky | ............ | H01L 25/065 165/80.1 |
| 6,865,085 B1 * | 3/2005 | Ferris | ............ | H05K 7/20445 165/185 |
| 6,894,907 B2 * | 5/2005 | Gustine | ............ | H05K 5/0004 361/756 |
| 6,897,377 B2 * | 5/2005 | Gustine | ............ | H05K 5/0004 174/542 |
| 6,940,014 B1 * | 9/2005 | Smith | ............ | H05K 5/0204 174/562 |
| 7,180,736 B2 * | 2/2007 | Glovatsky | ............ | H05K 7/20163 361/688 |
| 7,304,855 B1 * | 12/2007 | Milligan | ............ | G11B 33/128 361/724 |
| 7,349,216 B2 * | 3/2008 | Silverbrook | ............ | B41J 2/01 361/715 |
| 7,704,016 B2 * | 4/2010 | Gransaether | ............ | E21B 33/0385 166/338 |
| 8,279,604 B2 * | 10/2012 | Jones | ............ | H01Q 21/20 165/104.33 |
| 8,493,741 B2 * | 7/2013 | Davis | ............ | E21B 33/0355 174/70 S |
| 8,839,519 B2 * | 9/2014 | Altman | ............ | F28F 3/12 165/104.33 |
| 9,288,929 B1 * | 3/2016 | Wong | ............ | E21B 41/0007 |
| 9,439,312 B2 * | 9/2016 | Cornes | ............ | H05K 7/1432 |
| 9,644,471 B2 * | 5/2017 | Logan | ............ | E21B 47/01 |
| 9,665,134 B2 * | 5/2017 | Degner | ............ | G06F 1/181 |
| 2002/0008962 A1 * | 1/2002 | Hutchison | ............ | H04Q 1/10 361/704 |
| 2002/0054481 A1 * | 5/2002 | Gustine | ............ | H05K 7/20409 361/704 |
| 2002/0153419 A1 * | 10/2002 | Hall | ............ | G05B 19/00 235/400 |
| 2003/0026082 A1 * | 2/2003 | Gustine | ............ | H05K 5/0004 361/801 |
| 2005/0068743 A1 * | 3/2005 | Ferris | ............ | H05K 7/20445 361/721 |
| 2006/0176677 A1 * | 8/2006 | Glovatsky | ............ | H05K 1/144 361/796 |
| 2010/0290186 A1 * | 11/2010 | Zeng | ............ | H05K 7/20545 361/694 |
| 2011/0058336 A1 * | 3/2011 | Sundstrom | ............ | H05K 7/1404 361/710 |
| 2012/0069514 A1 * | 3/2012 | Ross | ............ | H05K 7/20727 361/679.33 |
| 2012/0151098 A1 * | 6/2012 | Sullivan | ............ | G06F 1/1607 710/13 |
| 2012/0287575 A1 * | 11/2012 | Nelson | ............ | H05K 7/1412 361/688 |
| 2012/0314354 A1 * | 12/2012 | Rayner | ............ | H01H 13/06 361/679.01 |
| 2013/0170129 A1 * | 7/2013 | Sullivan | ............ | G06F 1/185 361/679.32 |
| 2013/0314876 A1 | 11/2013 | Martin | | |
| 2014/0251577 A1 * | 9/2014 | Connors | ............ | H01L 23/36 165/67 |
| 2015/0116940 A1 * | 4/2015 | Kim | ............ | H05K 1/0203 361/700 |
| 2015/0146377 A1 * | 5/2015 | You | ............ | H05K 7/1432 361/707 |
| 2015/0146378 A1 * | 5/2015 | You | ............ | H05K 7/20254 361/707 |
| 2015/0173243 A1 * | 6/2015 | Chauhan | ............ | H05K 7/20336 165/104.26 |
| 2015/0181763 A1 * | 6/2015 | de Bock | ............ | B23P 15/26 361/689 |
| 2015/0345282 A1 * | 12/2015 | Logan | ............ | E21B 47/01 166/65.1 |
| 2015/0362964 A1 * | 12/2015 | Correll | ............ | H05K 7/1477 361/679.4 |
| 2016/0081177 A1 * | 3/2016 | Kirk | ............ | H05K 7/1404 174/252 |
| 2016/0088776 A1 * | 3/2016 | Cornes | ............ | H05K 7/2039 165/80.2 |
| 2016/0100505 A1 * | 4/2016 | Reid | ............ | H05K 7/20545 361/714 |
| 2016/0101807 A1 * | 4/2016 | Scholten | ............ | H05K 5/0065 361/707 |
| 2016/0105067 A1 * | 4/2016 | Bradfield | ............ | H02K 5/10 310/59 |
| 2016/0135316 A1 * | 5/2016 | Kristiansen | ............ | H05K 5/06 165/80.3 |
| 2016/0178771 A1 * | 6/2016 | Gateman | ............ | G01V 1/38 361/724 |
| 2016/0183404 A1 * | 6/2016 | Chochua | ............ | E21B 41/00 361/707 |
| 2017/0300095 A1 * | 10/2017 | Degner | ............ | G06F 1/20 |
| 2019/0032453 A1 * | 1/2019 | Bonel | ............ | E21B 41/0007 |

* cited by examiner

THERMAL CONDUCTION TO A CYLINDRICAL SHAFT

FIELD

The present disclosure relates to canister system and, more particularly, relates to a thermal conduction systems for use in a canister system.

BACKGROUND

This section provides background information related to the present disclosure which is not necessarily prior art.

Deep sea operations are an important part of many industries today. This is especially true in the oil and gas industry. As global energy demands increase and land-based oil and gas deposits decrease, there is a renewed demand to produce oil and gas from offshore locations. In fact, in 2007, more than a third of all produced oil was pumped from offshore locations. With advancements in shale production, the location of these oil production rigs is moving into deeper waters.

In the past, much of the equipment used in oil and gas production was located at the water surface on specially designed rigs. However, with advancements of deep water equipment, many of the required pumps, compressors, and mixing systems are now located subsurface, such as on the ocean floor. However, at these depths, the deep water equipment, including control and/or monitoring electronics, must be designed and configured to withstand the enormous water pressures exerted thereon. In fact, in some deep water applications, water pressure can exceed several hundred bar and water temperature can approach freezing (32 degrees Fahrenheit).

There are significant benefits in having control and/or monitoring electronics at subsurface locations, and particularly on the ocean floor. On site (e.g. subsurface) location of this equipment ensures that communication systems and lines are less likely to fail due to shortened communication lines and, thus, such systems can provide active control and monitoring of the associated equipment to ensure safe and reliable operation of the production equipment.

However, to enhance reliability of the control and/or monitoring electronics in such an extreme pressure and temperature environment, it is necessary to provide a protective enclosure that can stave off detrimental environmental effects, such as pressure and overheating, and further provide a safe and reliable enclosure and connection methodology to minimize the need for maintenance and/or replacement that can lead to significant operational downtime.

For at least these reasons, there appears to be a need to provide a canister system capable of overcoming the disadvantages of the prior art.

SUMMARY

This section provides a general summary of the disclosure, and is not a comprehensive disclosure of its full scope or all of its features.

According to the principles of the present teachings, a canister system having a cylindrical housing and a modular electronic rack system disposed within the cylindrical housing is provided having advantageous construction and operation. The modular electronic rack system includes a thermal contact member that is in at least selective physical contact with an interior surface of the cylindrical housing to permit conductive heat transfer there through. An input/output device extends along at least a portion of the modular electronic rack system and includes a power input and a signal output electrically coupled thereto. A plurality of electronic slots disposed at a position generally along the modular electronic rack system is provided.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Figure 1:
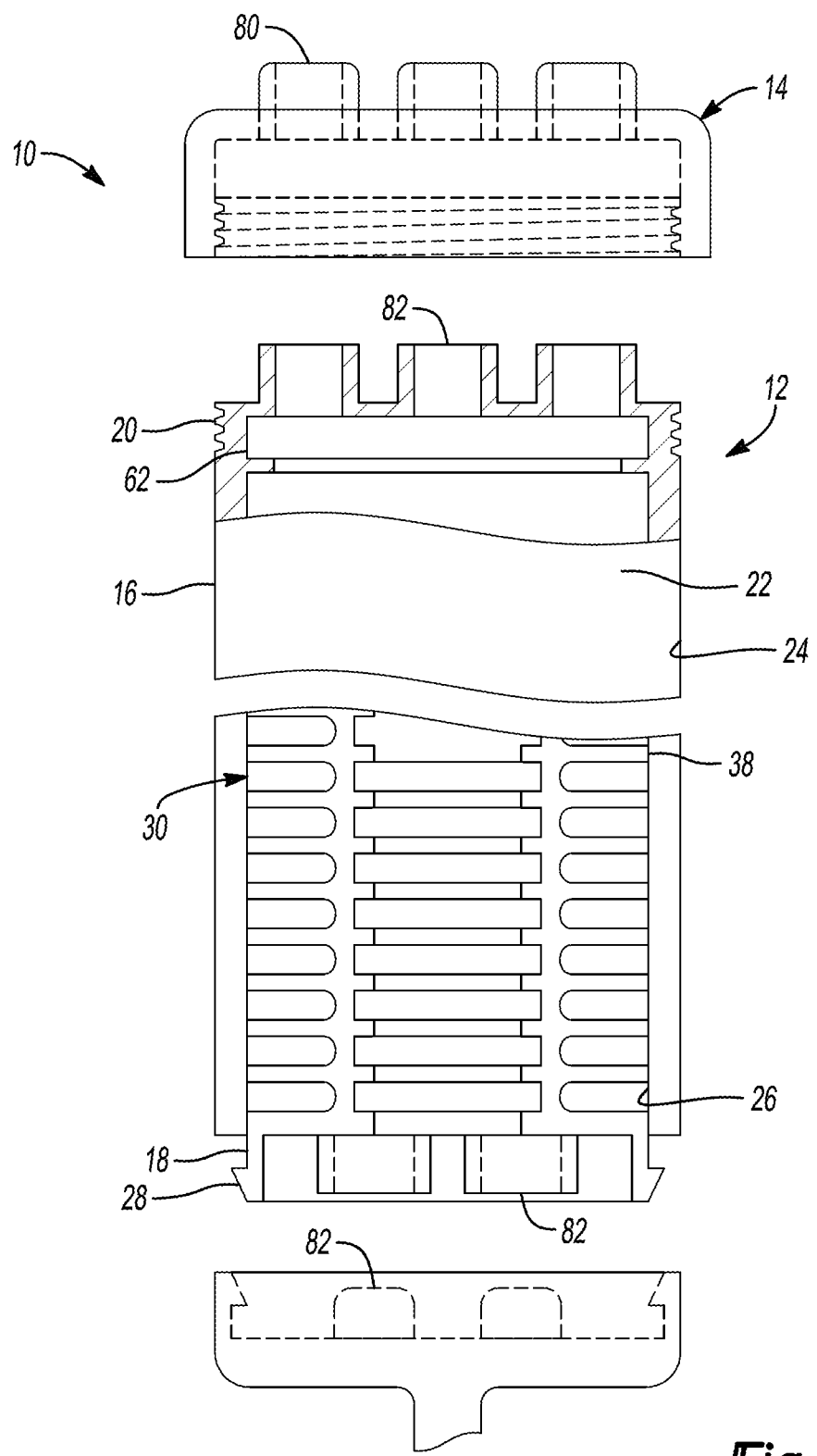
FIG. 1 is a schematic view illustrating a canister system according to the principles of the present teachings.

Example embodiments will now be described more fully with reference to the accompanying drawings.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

As discussed herein, to enhance reliability of the control and/or monitoring electronics in such an extreme pressure and temperature environment, it is necessary to provide a protective enclosure that can stave off detrimental environmental effects, such as pressure and overheating, and further provide a safe and reliable enclosure and connection methodology to minimize the need for maintenance and/or replacement that can lead to significant operational downtime.

To this end, according to the principles of the present teachings, a cylindrical canister system 10 is provided that is capable of overcoming the disadvantages of the prior art. Specifically, the canister system 10 of the present teachings employ a plurality of innovations that minimize or eliminate the use of features or systems that traditionally fail in deep sea or other extreme environments. It should be understood, however, that although many innovations will be described in connection with the present disclosure, these innovations should not be regarded as being required in each and every embodiment. Therefore, claims directed to portions of the present disclosure are presented that do not require all elements described herein, unless otherwise noted.

Although the present teachings are described in connection with deep sea applications, it should also be appreciated that the principles of the present teachings may find utility in a wide range of applications, including any environment where pressure, temperature, vibration, debris, contamination, and other environmental effects may lead to reduced operational reliability and/or failure. The principles of the present teachings are particularly well suited for marine applications, and thus the systems are designed and configured for waterproof operations.

With particular reference to FIG. 1, canister system 10, according to some embodiments of the present teachings, can comprise a housing 12. In some embodiments, housing 12 is a cylindrical member having an elongated shape defining a cylindrical sidewall 16 having opposing ends 18, 20. In some embodiments, bottom end 18 can be integrally formed with sidewall 16 to form a continuous member. Bottom end 18 can terminate and enclose the respective end of housing 12 via a bottom cap or integrally-formed surface, thereby forming an internal volume 22 within housing 12. For purposes of the present disclosure, bottom end 18 refers to both the locational end of cylindrical sidewall 16 and the associated cap or closure surface formed there at. Internal volume 22 is defined by an interior surface 24 of cylindrical sidewall 16 and an interior surface 26 of bottom end 18.

In some embodiments, housing 12 further comprises a head member 14 that is connectable with cylindrical sidewall 16. In some embodiments, head member 14 is releasably or detachably coupled to cylindrical sidewall 16 at top end 20 to permit access to internal volume 22 of canister system 10 after assembly. To this end, head member 14 can be coupled to cylindrical sidewall 16 in such a way as to permit convenient detachment of head member 14 from sidewall 16, such as via the use of a threaded system or other releasable connection system. However, in some embodiments requiring a more permanent connection between head member 14 and cylindrical sidewall 16, alternative coupling means can be used, including, but not limited to, welding, bonding, and the like.

With continued reference to FIG. 1, in some embodiments, canister system 10 can comprise a locking or mating mechanism 28 that is engageable with a corresponding system for mounting and/or anchoring canister system 10 in a predetermined position or location. In some embodiments, mating mechanism 28 can comprise a plurality of projections that can be received within corresponding features of a base system.

Housing 12, including cylindrical sidewall 16, bottom end 18, and head member 14, is configured to withstanding the associated environmental conditions in which it is intended to be disposed. For example, in some embodiments, housing 12 is configured to withstand the extreme water pressure and salinity of deep sea operations. To this end, housing 12 can include increase wall thickness and corrosion treatment. By way of non-limiting example, in some embodiments, canister system 10 is configured to withstand pressures at depths of about 500 m-3000 m (or more) in the range of about 700 psi to about 5000 psi (or more). More particularly, in some embodiments, ruggedized canister system 10 is configured to withstand pressure in the range of about 1400 psi to about 4500 psi. Moreover, in some embodiments, ruggedized canister system 10 is particularly configured to withstand environmental contaminants including, but not limited to, corrosion, chemical degradation, and the like.

Modular Electronics for Cylinders

In conventional designs, underwater electronic systems often employ various cables and/or wiring to electrically interconnect the electronics within the system. These cables and wires are typically routed throughout the canister as necessary to achieve the desired connection protocol, which results in excessive complexity and increased potential for connection failures and associated downtime due to the plurality of connection joints. It has been determined that due to the nature of deep sea applications and other extreme environments, such cables and wires should be minimized or avoided to in turn minimize or avoid susceptible connection joints.

Figure 2:
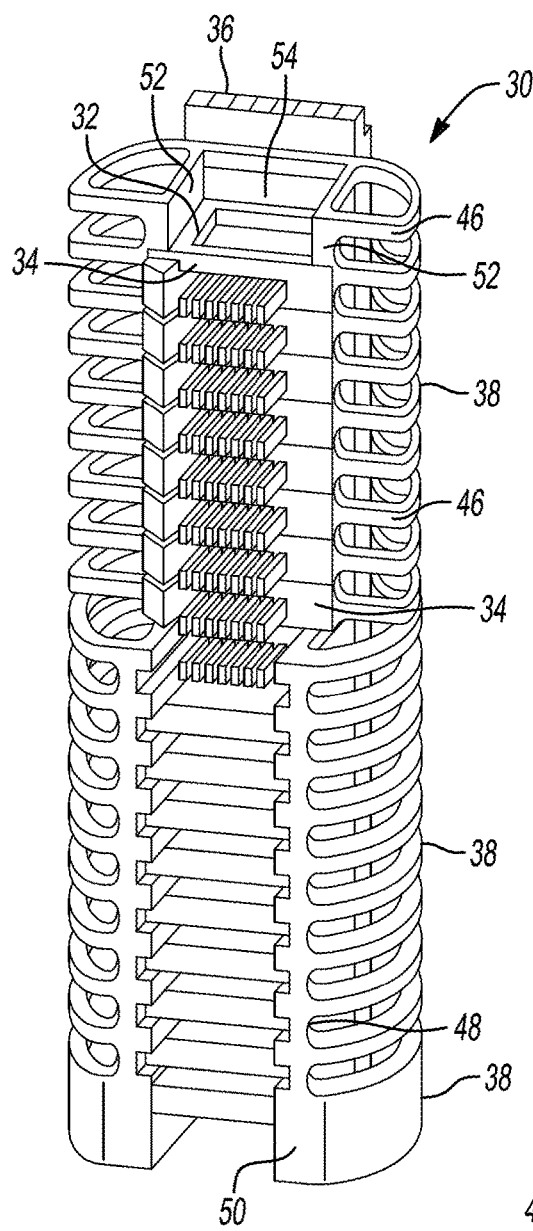
FIG. 2 is a front perspective view illustrating a modular electronics rack system according to the principles of the present teachings.
Figure 3:
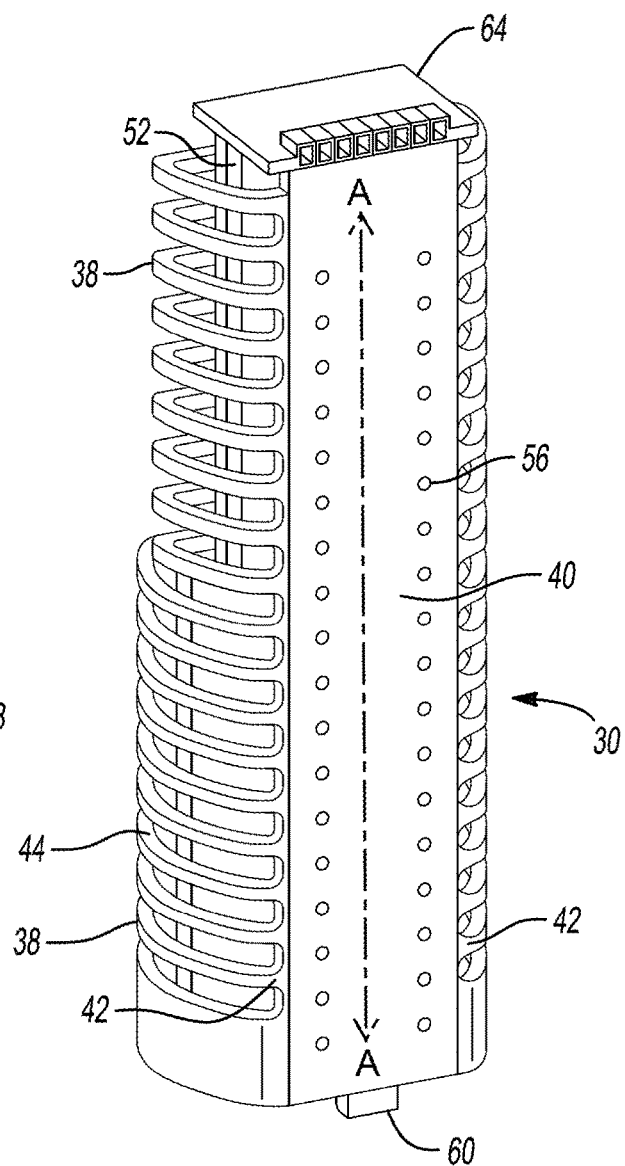
FIG. 3 is a rear perspective view illustrating a modular electronics rack system according to the principles of the present teachings.

To this end, in some embodiments, the present teachings provide modular electronics and an associated rack system to permit simplified interconnection of the electronics without unnecessary cabling and wiring. As illustrated in FIGS. 2 and 3, in some embodiments, the present teachings provide a modular electronic rack system 30 that defines a number of benefits over the prior art.

Modular electronic rack system 30 is configured to be disposed within interior volume 22 of housing 12 and support a plurality of electronics modules. To this end, in some embodiments, modular electronic rack system 30 can comprise a cage-type system having a plurality of individual electronic slots 32 for receiving a respective one of a plurality of modular electronic cards 34. Electronic cards 34 can each be electrically coupled to a high density input/output (I/O) board 36 via known connection methods, such as a backplane that directly routes signals to the top of the canister. The plurality of modular electronic cards 34 can comprise any one of a number of electronic cards, including printed circuit boards and the like.

In some embodiments, modular electronic rack system 30 can comprise a structural cage assembly having a plurality of rib members 38 radiating outwardly from a backplane 40 (see FIG. 3). Each of the plurality of rib members 38 extends from backplane 40 in a direction generally orthogonal to a longitudinal axis A-A of backplane 40. A proximal end of each rib member 38 can be fixedly coupled or integrally formed with backplane 40 and arcuately extend therefrom to a forward position. That is, when viewed from above, each rib member 38 can define a circular profile that closely conforms to that of interior surface 24 of cylindrical sidewall 16.

In some embodiments, rib member 38 can define a rear transition region 42 adjacent backplane 40 that transitions the backplane surface to an arcuate section or surface 44. In some embodiments, arcuate section 44 is sized and shaped to closely conform to interior surface 24 of sidewall 16 of housing 12. In this way, arcuate section 44 of rib members 38 can physically engage and/or contact interior surface 24 of sidewall 16 to provide structural resistance to compression of housing 12 caused by external pressure (e.g. underwater pressure). Accordingly, in some embodiments, modular electronic rack system 30 is configured and adapted to withstand compression force exerted on housing 12 and transferred those forces to modular electronic rack system 30. In this way, modular electronic rack system 30, in some embodiments, can serve as both a modular electronics rack system supporting a plurality of electronic cards 34 and electronically coupling the same and further providing substantial structural support to housing 12. In some embodiments, modular electronic rack system 30 is capable of withstanding up to about 100% of the present compressive force.

In some embodiments, rib members 38 can further extend from arcuate section 44 to a generally flat surface 46. As illustrated in FIG. 2, flat surface 46 can be formed in a portion of rib members 38, while other rib members 38 can include a continued arcuate section 44 terminating at a front transition region 48. In some embodiments, flat surface 46 and/or front transition region 48 of each rib member 38 can be joined along a sternum section 50. Sternum section 50 provides, at least in part, structural support for rib members 38 and the overall structure of modular electronic rack system 30. In some embodiments, sternum section 50 can comprise a pair of interior wall members 52 extending inwardly from flat surface 46 and/or front transition region 48 to define a pair of inner walls on opposing sides of individual electronics slots 32. Interior wall members 52 can terminate at a position adjacent an inner surface 54 of backplane 40. Depending on the method of manufacturing employed (e.g. casting), interior wall members 52 can be integrally formed with backplane 40.

In some embodiments, the plurality of individual electronic slots 32 is arranged in a stacked configuration. Each of the plurality of individual electronic cards 34 can be electrically coupled to each of the corresponding electronic slots 32 of I/O board 36 extending along backplane 40. In this way, I/O board 36 and/or individual electronic slots 32 can be coupled to backplane 40, such as via alignment and/or keying pins 56 extending through backplane 40. It should be understood, however, that other configurations, such as vertically-oriented stacking or other orientations, are anticipated.

In some embodiments, I/O board 36 can define one or more printed circuit boards having individual electronic slots 32 disposed thereon and integrated therewith, thereby permitting electrical interconnection and/or coupling of each of the individual electronic slots 32 without the need for separate cabling or wires. In such embodiments, benefits can be realized through reduced complexity and failure modes. However, it should be understood that I/O board 36 can also be configured to have other connecting systems, such as ribbon cables, PWB flex cables and the like.

In some embodiments, as illustrated in FIG. 3, a power input 60 can further be employed and operably coupled to I/O interface 36/backplane 40. Specifically, in some embodiments, power input 60 can be operably coupled to backplane 40 to supply power from an external source to components disposed within canister system 10, such as the plurality of electronic cards 34. To this end, in some embodiments, power input 60 can be disposed along a bottom portion of modular electronic rack system 30 to minimize the distance interface between power input 60 and I/O interface. In this way, power input 60 can be directly mounted and electrically coupled to I/O interface to minimize or eliminate the use of cabling or wiring. Moreover, in this way, the relative orientation of power input 60 can be fixed relative to I/O board 36 for improved dependability and reliability. Still further, the relative orientation of power input 60 relative to bottom end 18 of housing 12 can be fixed relative to an external throughput connector extending through housing 12, as will be discussed herein. However, it should be understood that power input 60 can also be disposed along a top portion of modular electronic rack system 30, if desired.

Similarly, in some embodiments as illustrated in FIGS. 1-3, an I/O interface head 62 can be further employed and operably coupled to I/O interface board 36. Specifically, in some embodiments, interface head 62 (shown in FIG. 1) can be operably coupled to I/O interface board 36 to permit input/output communications with sensors and/or devices external to the components disposed within canister system 10, such as the plurality of electronic cards 34. To this end, in some embodiments, interface head 62 can be disposed along a top portion of modular electronic rack system 30 to minimize the distance interface between interface head 62 and I/O board 36. In this way, interface head 62 can be directly mounted and electrically coupled to I/O interface board 36, such as via an interface adapter board 64 (shown in FIG. 3), to minimize or eliminate the use of cabling or wiring. Moreover, in this way, the relative orientation of interface head 62 can be fixed relative to I/O interface board 36 for improved dependability and reliability. Still further, the relative orientation of interface head 62 relative to head member 14 of housing 12 can be fixed relative to an external throughput connector extending through housing 12 (e.g. head member 14), as will be discussed herein.

Thermal Conduction to a Cylinder or Cylindrical Shaft

In some embodiments, it may be desirable to dissipate heat that builds up or is contained within canister system 10. Specifically, in some embodiments, heat can be dissipated through conduction via physical contact between modular electronic rack system 30 contained within housing 12 and housing 12.

In order to achieve the necessary physical contact between modular electronic rack system 30 and internal surface 24 of housing 12, in some embodiments, rib members 38 or other structure of modular electronic rack system 30 can be sized to closely conform with internal surface 24 to achieve conductive contact to permit heat energy to flow between modular electronic rack system 30, housing 12, and the environment surrounding canister system 10 (e.g. water). In this way, heat generated through the operation of electronic cards 34 and other components can radiate and/or conduct to modular electronic rack system 30. Heat contained in modular electronic rack system 30 can then be conducted to housing 12 and then to the environment surrounding canister system 10.

In some embodiments, the surface area in contact between modular electronic rack system 30 and housing 12 is sufficient to effect the necessary cooling of electronic cards 32 to maintain a predetermined operational temperature. However, as it should be appreciated, the sufficiency of this arrangement is dependent on the amount of heat generated by the plurality of electronic cards 32 and other components and the heat transfer potential to the environment surrounding the canister system 10.

In some applications, additional heat transfer rates may be desired. In some embodiments, a conduction plate, thermal contact, or other feature can be used between modular electronic rack system 30 and housing 12 to increase the surface area contact therebetween to improve heat transfer.

In some embodiments, the contact between modular electronic rack system 30 and housing 12 can be enhanced by virtue of the compression of housing 12 when exposed to increased external pressure (e.g. water pressure). In this way, increased external pressure can cause compression of housing 12 sufficient to force contact between housing 12 and modular electronic rack system 30, as described herein. Such contact increases the contact area and, thereby, increases heat transfer.

Figure 4:
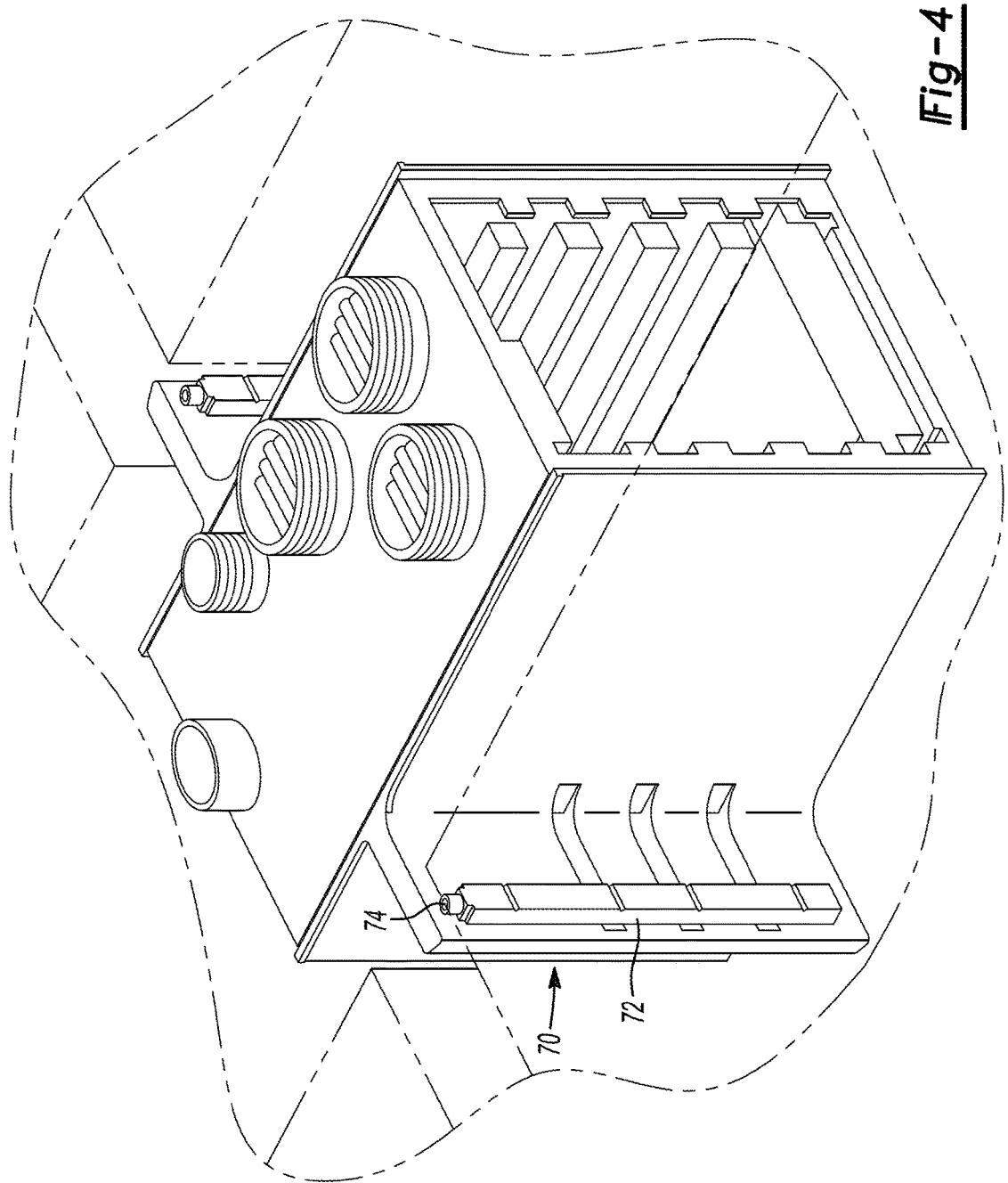
FIG. 4 is an enlarged perspective view illustrating a portion of the modular electronics rack system having a wedge lock system according to the principles of the present teachings.

Similarly, in some embodiments, alternative features can be used to enhance the contact between modular electronic rack system 30 and housing 12 in conditions absent from sufficient external compressive forces, such as low pressure environments. In such applications, as illustrated in FIG. 4, a wedge lock system 70 that is capable of exerting a force upon modular electronic rack system 30 to force modular electronic rack system 30 against internal surface 24 of housing 12 to achieve a predetermined thermal/physical contact therebetween. Wedge lock system 70 can comprise a wedge cam member 72 being coupled to modular electronic rack system 30, such as along the opposite side of the thermal interface. In some embodiments, actuation of an adjustment device or screw 74 can actuate wedge cam member 72 translate and exert a force between modular electronic rack system 30 and a feature of housing 12.

Alignment Mechanism for Cabling to a Cylinder Head

As should be appreciated, electrical connections to I/O board 36 and/or power input 60 must be routed to, from, and/or through housing 12. Due to the aforementioned environment in which the present teachings are particularly suited (e.g. marine applications), it should be appreciated that these electrical connections must permit electrical transmission and/or communication, and must also be sufficient to withstand the pressure, temperature, and any contaminant present in the surrounding environment.

Therefore, electrical connections to I/O board 36 and/or power input 60 can be routed through housing 12 via sealed connectors 80 to establish and maintain electrical communication with modular electronic rack system 30 and/or electronic cards 32. That is, sealed connectors 80 are configured to reliably establish electrical communication from a position external to canister system 10 to a position within canister system 10.

In some embodiments, as illustrated in FIG. 1, sealed connectors 80 can comprise a plurality of contacts 82 extending from electrical systems, such as I/O board 36 and/or power input 60. In some embodiments, the plurality of contacts 82 can comprise Ethernet, RS232, RS485, CAN and digital and analog I/O inputs and outputs.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A canister system comprising:
    a cylindrical housing;
    a modular electronic rack system disposed within said cylindrical housing, said modular electronic rack system having a plurality of generally parallel, thermally conductive, ribs arranged generally perpendicularly to a central axis of the cylindrical housing a housing and extending away from a backplane in an arcuate manner, said plurality of ribs being in physical contact with an interior surface of said cylindrical housing to permit conductive heat transfer there through, said plurality of ribs supported by and extending away from the backplane at a first end and the backplane being arranged generally parallel to the central axis of the cylindrical housing;
    an input/output board extending along at least a portion of said modular electronic rack system, said input/output board having a power input and a signal output electrically coupled thereto; and
    a plurality of generally planar, parallel electronic slots defined by adjacent and opposite pairs of ribs in proximity to a second end of the ribs opposite the backplane and arranged perpendicularly to the backplane, each slot configured to receive a generally planar electronic card arranged perpendicularly to the backplane and inserted into the slot for electronic coupling to a corresponding slot in the backplane.

2. The canister system according to claim 1 wherein said plurality of electronic slots is configured to physically and operably receive an electronic card therein, each of said plurality of electronic slots being electrically connected to said input/output board to establish electrical communication between the electronic card and said input/output board.

3. The canister system according to claim 1, wherein physical contact between said plurality of ribs and said interior surface of said cylindrical housing is adjustable to selectively vary the conductive heat transfer.

4. The canister system according to claim 3 further comprising a wedge cam device operable to selectively exert a driving force to urge said plurality of ribs into said physical contact with said interior surface.

5. A canister system comprising:
a cylindrical housing;
a modular electronic rack system disposed within said cylindrical housing, said modular electronic rack system having a plurality of generally parallel rib members arranged generally perpendicularly to a central axis of the cylindrical housing and extending away from a backplane in an arcuate manner, said plurality of rib members being in physical contact at a variable force with an interior surface of said cylindrical housing to permit variable conductive heat transfer there through, said plurality of rib members supported by and extending away from a planar backplane at a first end the backplane being arranged generally parallel to the central axis of the cylindrical housing;
an input/output board extending along at least a portion of said modular electronic rack system, said input/output board having a power input and a signal output electrically coupled thereto;
a plurality of generally planar, parallel electronic slots defined by adjacent pairs of ribs in proximity to a second end of the ribs opposite to the backplane and arranged perpendicularly to the backplane, each slot configured to receive a generally planar electronic card arranged perpendicularly to the backplane and inserted into the slot for electronic coupling to the backplane, wherein the plurality of parallel electronic slots is dispose at a position generally along said modular electronic rack system; and
said plurality of rib members being adjustable to selectively vary a force of said physical contact with said interior surface of said cylindrical housing.

6. The canister system according to claim 5 wherein said plurality of electronic slots is configured to physically and operably receive an electronic card therein, each of said plurality of electronic slots being electrically connected to said input/output board to establish electrical communication between the electronic card and said input/output board.

7. The canister system according to claim 5 further comprising a wedge cam device operable to selectively exert a driving force to urge said rib members into said physical contact with said interior surface.

8. The canister system according to claim 7 wherein said backplane has a longitudinal axis generally parallel to a longitudinal axis of said cylindrical housing.

\* \* \* \* \*